United States Patent
Jang (10) Patent No.: US 9,525,394 B2
(45) Date of Patent: Dec. 20, 2016

(54) BAND PASS FILTER

(71) Applicant: SAMSUNG ELECTRO-MECHANICS CO., LTD., Suwon, Gyunggi-do (KR)

(72) Inventor: Seung Goo Jang, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 257 days.

(21) Appl. No.: 13/844,004

(22) Filed: Mar. 15, 2013

(65) Prior Publication Data

US 2014/0184357 A1 Jul. 3, 2014

(30) Foreign Application Priority Data

Dec. 27, 2012 (KR) .................... 10-2012-0154554

(51) Int. Cl.
*H03H 7/01* (2006.01)
*H03H 1/00* (2006.01)

(52) U.S. Cl.
CPC .......... *H03H 7/0115* (2013.01); *H03H 7/1766* (2013.01); *H03H 7/1791* (2013.01); *H03H 2001/0085* (2013.01)

(58) Field of Classification Search
CPC ............ H03H 2001/0085; H03H 7/0115; H03H 7/1791; H03H 7/1766
USPC ........................ 333/175, 185, 208
See application file for complete search history.

(56) References Cited

U.S. PATENT DOCUMENTS

| 6,507,251 | B2 * | 1/2003 | Mizoguchi | ............ H01P 1/203 333/185 |
| 2001/0035803 | A1 * | 11/2001 | Matsumura | ......... H01P 1/20381 333/185 |
| 2002/0190821 | A1 * | 12/2002 | Tada et al. | .................... 333/206 |
| 2005/0140473 | A1 * | 6/2005 | Jun | ........................ H01P 1/203 333/204 |
| 2006/0082425 | A1 * | 4/2006 | Jun | ........................ H01P 1/203 333/204 |
| 2006/0145782 | A1 * | 7/2006 | Liu | ....................... H03H 7/463 333/132 |
| 2007/0241839 | A1 | 10/2007 | Taniguchi | |
| 2009/0009267 | A1 * | 1/2009 | Miyata | ................. C04B 35/265 333/185 |

(Continued)

FOREIGN PATENT DOCUMENTS

| KR | 10-0314620 | 11/2001 |
| KR | 10-2007-0061093 A | 6/2007 |

(Continued)

OTHER PUBLICATIONS

Korean Office Action issued in Korean Application No. 10-2012-0154554 dated Feb. 15, 2014, with English Translation.

*Primary Examiner* — Stephen E Jones
*Assistant Examiner* — Rakesh Patel
(74) *Attorney, Agent, or Firm* — NSIP Law (57) ABSTRACT

There is provided a band pass filter including: a first substrate including a plurality of capacitors and a plurality of conductive patterns provided thereon; and a second substrate laminated with the first substrate and connected to the plurality of first conductive patterns through a plurality of via holes, wherein an attenuation frequency is determined according to the amount and shape of the plurality of via holes.

16 Claims, 7 Drawing Sheets

(56) References Cited

U.S. PATENT DOCUMENTS

| | | | | |
|---|---|---|---|---|
| 2009/0033439 A1* | 2/2009 | Igarashi | ............... | H03H 7/0115 |
| | | | | 333/185 |
| 2010/0026420 A1* | 2/2010 | Chin | .................... | H03H 7/0115 |
| | | | | 333/185 |
| 2012/0319801 A1* | 12/2012 | Taniguchi | ..................... | 333/185 |

FOREIGN PATENT DOCUMENTS

| KR | 10-2008-0096820 A | 11/2008 |
|---|---|---|
| KR | 10-0969766 B1 | 7/2010 |

* cited by examiner

BAND PASS FILTER

CROSS-REFERENCE TO RELATED APPLICATIONS

This application claims the priority of Korean Patent Application No. 10-2012-0154554 filed on Dec. 27, 2012, in the Korean Intellectual Property Office, the disclosure of which is incorporated herein by reference.

BACKGROUND OF THE INVENTION

Field of the Invention

The present invention relates to a band pass filter formed to include a conductive pattern and a capacitor on a substrate on which a plurality of layers are laminated, capable of easily setting a desired attenuation frequency by adjusting an amount or a shape of via holes provided in the substrate, and being implemented to have a simple structure to stabilize fabrication costs and process yields, and the like.

Description of the Related Art

A band pass filter (BPF) is a filter only allowing a signal having a particular frequency band to pass therethrough and blocking other signals, widely used for the purpose of only selecting a signal having a particular frequency band in a wireless signal transceiver. A frequency band allowed to pass through a band pass filter and a blocked frequency band are classified based on an attenuation frequency, and the characteristics of a band pass filter are determined by an attenuation frequency, an amount of insertion loss, a bandwidth, and the like.

The band pass filter attenuates signals in all frequency bands other than a frequency band used by a wireless transceiver. For a power amplifier, an attenuation frequency band may be a main cause of generating a secondary harmonic component. In general, for band pass filters used to date, designing a usage band has been preferentially considered, and for an attenuation frequency band, an additional circuit for preventing a harmonic component, or the like, may be added.

The use of an additional circuit in order to prevent a harmonic component generated in an attenuation frequency band has an advantage in that the design of a usage frequency band is considered a top priority. However, the additional circuit may disadvantageously increase insertion loss of the band pass filter in a pass frequency band or increase a physical size of the filter.

Cited invention 1 relates to a band pass filter embedded in an integrated passive element substrate in which stop band characteristics are improved in a particular frequency band by generating a parasitic inductance component in a substrate including a via hole structure. Cited invention 2 relates to a method for manufacturing a multilayer filter in which a plurality of dielectric sheets are multilayered and an inductor electrode and a capacitor electrode are connected by a via hole to adjust a passage frequency band, or the like. However, cited inventions 1 and 2 do not disclose a technique of adjusting the amount or shape of via holes or a technique in which a non-conductive region is provided in a portion adjacent to a via hole on a particular surface of a substrate to select an attenuation frequency value.

RELATED ART DOCUMENT (Patent document 1) Korean Patent Laid Open Publication No. KR 10-0969766-0000

(Patent document 2) Korean Patent Laid Open Publication No. KR 10-0314620-0000

SUMMARY OF THE INVENTION

An aspect of the present invention provides a band pass filter in which a plurality of capacitors and a first conductive pattern are formed on a first surface of a substrate including a plurality of via holes, and a second conductive pattern is provided on a second surface of the substrate, at least a portion of the first conductive pattern, the second conductive pattern, and the plurality of capacitors are connected via holes, and in particular, an attenuation frequency value may be selected by providing a non-conductive region in a partial region of the second surface adjacent to the via holes or by regulating the amount and shape of via holes.

According to an aspect of the present invention, there is provided a band pass filter including: a first substrate including a plurality of capacitors and a plurality of conductive patterns provided thereon; and a second substrate laminated with the first substrate and connected to the plurality of first conductive patterns through a plurality of via holes, wherein an attenuation frequency is determined according to the amount and shape of the plurality of via holes.

The second substrate may include a non-conductive region provided to be adjacent to a region in contact with the plurality of via holes.

As the number of the plurality of via holes is increased, the attenuation frequency may be determined to have a larger value.

As an extended length of the plurality of via holes is lengthened by a shape of the plurality of via holes, the attenuation frequency may be determined to have a smaller value.

In order to determine the attenuation frequency to have a smaller value, the plurality of via holes may have a spiral shape.

The second substrate may include one or more second conductive patterns connected to the plurality of first conductive patterns through the plurality of via holes.

At least one of the one or more second conductive patterns may be electrically grounded (GND).

The plurality of capacitors may include a multilayer ceramic capacitor (MLCC), and the first and second substrates may be printed circuit boards (PCBs).

According to another aspect of the present invention, there is provided a band pass filter including: a substrate having a laminated structure and including a plurality of via holes; a plurality of capacitors provided on a first surface of the substrate; and a first conductive pattern provided on the first substrate to connect at least a portion of the plurality of capacitors, wherein the first conductive pattern is connected to a second conductive pattern provided on a second surface of the substrate through the plurality of via holes, and the second surface includes a non-conductive region provided to be adjacent to a region in contact with the plurality of via holes.

At least a portion of the second conductive pattern may be electrically grounded.

The band pass filter may have an attenuation frequency determined by at least one of capacitance of the plurality of capacitors and the amount and shape of the plurality of via holes.

At least a portion of the plurality of via holes may have a spiral shape.

The substrate may be a printed circuit board and the plurality of capacitors may include one or more multilayer ceramic capacitors.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 1:
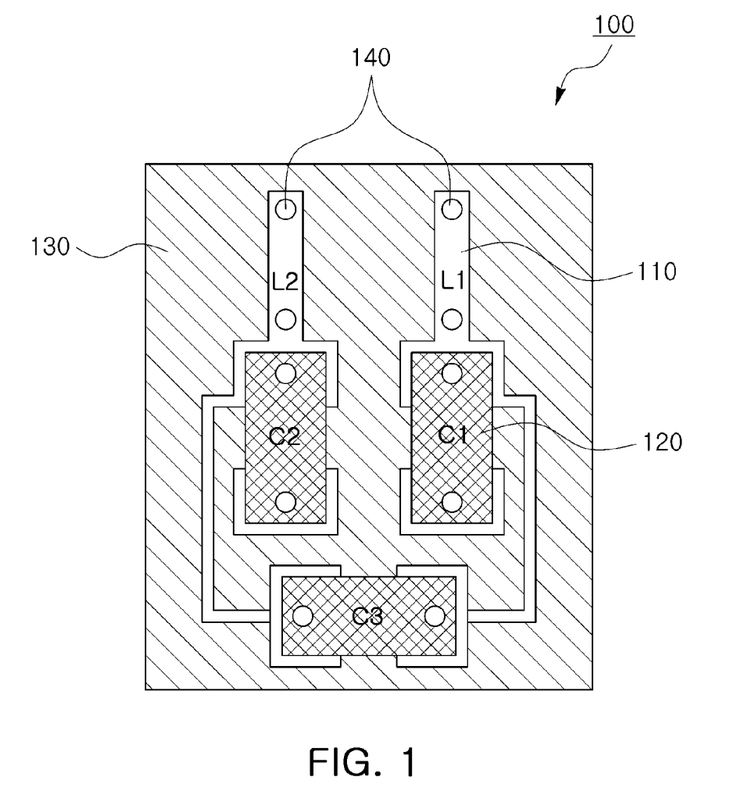
FIG. 1 is a plan view of a band pass filter according to an embodiment of the present invention.

FIG. 1 is a plan view of a band pass filter according to an embodiment of the present invention;

FIG. 1 is a plan view illustrating a first substrate 130 of a band pass filter 100 according to an embodiment of the present invention. Referring to FIG. 1, the band pass filter 100 according to the present embodiment may include inductors 110, a plurality of capacitors 120, and a plurality of via holes provided on the first substrate 130.

A plurality of conductive patterns formed on the substrate 130 may be utilized as inductors 110 L1 and L2, and the inductors 110 L1 and L2 may be connected to at least a portion of the plurality of capacitors 120 C1, C2, and C3. A resonance frequency of the band pass filter 100 may be determined by a length or a width of the first conductive pattern determining capacitance values of the capacitors 120 C1 and C2 and inductance values of the inductors 110 L1 and L2.

For example, a resonance frequency of the band pass filter 100 is in inverse proportion to capacitance values of the capacitors 120 C1 and C2 and a length of the first conductive pattern, and in proportion to a width of the first conductive pattern. In comparison to the capacitance values of the capacitors 120 C1 and C2, the width and length of the first conductive pattern constituting the inductors 110 may be minutely adjusted, so a limitation of the capacitance values of the capacitors 120 C1 and C2 in designing a resonance frequency can be complemented. When a resonance frequency determined by the inductor 110 L1 and the capacitor 120 C1 is f1 and a resonance frequency determined by the inductor 110 L2 and the capacitor 120 C2 is f2, a bandwidth of the band pass filter 100 is determined as |f1−f2|. Also, an intermediate frequency of a passband may be determined as (f1+f2)/2.

The capacitor 120 C3 not involving in the determining of the resonance frequency determines insertion loss of the band pass filter 100 and a magnitude of a stop band. For example, insertion loss of the band pass filter 100 and a magnitude of a stop band may be in inverse proportion to the capacitance value of the capacitor 120 C3. Here, fine adjustment of the magnitude of attenuation and insertion loss unadjustable due to a change in the capacitance value of the capacitor 120 C3 may be adjusted by determining a coupling component according to a distance between the inductors 110 L1 and L2.

Referring to FIG. 1, the inductors 110 L1 and L2 are disposed to face each other. Thus, the inductors 110 L1 and L2 form mutual inductance, allowing the resonance frequencies f1 and f2 to be combined, resultantly forming a passband.

In FIG. 1, the band pass filter 100 may include one or more via holes 140. The via holes 140 are connected to a second substrate (not shown) provided in a side opposing the first substrate 130 through the first substrate 130. A conductive pattern electrically grounded, a non-conductive region, and the like, may be provided on the second substrate. The first conductive pattern constituting the inductor 110, a conductive pattern or a non-conductive pattern, and the like, may be connected via the via holes 140. This will be described with reference to the side view of FIG. 2.

Figure 2:
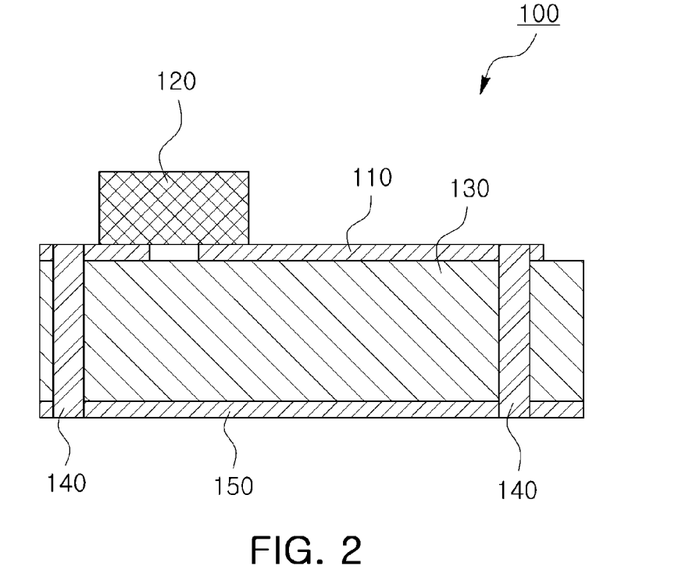
FIG. 2 is a side cross-sectional view of the band pass filter illustrated in FIG. 1.

FIG. 2 is a side cross-sectional view of the band pass filter illustrated in FIG. 1.

Referring to FIG. 2, the band pass filter 100 according to the present embodiment may include a first conductive pattern forming the inductor 110, a plurality of capacitors 120 connected to the first conductive pattern, the via holes 140, and the like. Also, a second conductive pattern may be provided within the via hole 140 to connect the first conductive pattern 110 and a conductive pattern 150 grounded on a lower surface of the band pass filter 100, and the like. Meanwhile, at least a portion of the plurality of capacitors 120 may be a multilayer ceramic capacitor.

For example, a height of the substrate constituting the band pass filter 100 may have a value of 3 times a height of the first conductive pattern. Also, as described above, at least a portion of a lower surface facing an upper surface of the band pass filter 100 in which the capacitor 120 is prepared may be electrically grounded (GND).

As the substrate included in the band pass filter 100, a printed circuit board (PCB) may be selected. At least one of the plurality of capacitors 120 is selected as a multilayer ceramic capacitor and the band pass filter 100 is configured by using a PCB, increasing production yield and lowering costs. Also, by changing the structure of the first conductive pattern, the via holes, and the like, constituting the circuit in the PCB, an attenuation degree of a particular frequency band can be adjusted while maintaining the characteristics of the band pass filter 100 without increasing an overall size or degrading performance thereof.

Meanwhile, a partial structure of the band pass filter 100 according to the present embodiment may be varied according to desired band characteristics. Hereinafter, various modifications of the band pass filter 100 according to an embodiment of the present invention will be described with reference to FIGS. 3 through 7.

FIGS. 3 through 7 are plan views illustrating modifications of a structure of the band pass filter according to an embodiment of the present invention.

Figure 3:
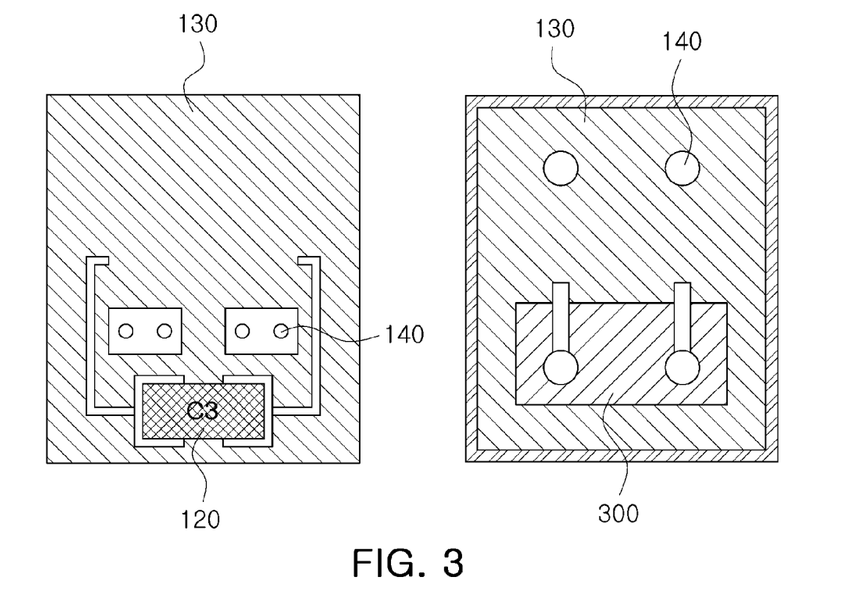
FIGS. 3 through 7 are plan views illustrating modifications of a structure of the band pass filter according to an embodiment of the present invention.

First, referring to FIG. 3, a modifiable partial region in the band pass filter 100 according to the present embodiment is illustrated separately. First, referring to a first surface of the band pass filter 100 in which the capacitor 120 is disposed, a design of the third capacitor 120 C3 and a partial conductive pattern 140 connecting the third capacitor 120 C3 to the first and second capacitors 120 C1 and C2 may be altered. Also, the amount, shape, and the like, of the via holes 140 connecting the first and second capacitors 120 C1 and C2 of the band pass filter 100 may also be altered.

The number of via holes 140 is in inverse proportion to inductance of the band pass filter 100. Namely, when the number of the via holes 140 is increased, inductance of the band pass filter 100 is reduced, and thus, a frequency of an attenuation band may be increased. Meanwhile, the inductance of the band pass filter 100 may be changed by altering a shape of the via hole 140. The via hole 140 may be formed to have a spiral shape, rather than a simple linear shape, to increase the inductance value and reduce a frequency of the attenuation band.

A second surface of the band pass filter 100 is illustrated in a right portion in FIG. 3. The via hole 140 connected to the first and second capacitors 120 C1 and C1 or the inductors 110 L1 and L2 may be prepared. A conductive or non-conductive region 300 may be provided in a peripheral region of at least a portion of the holes 140. When a non-conductive region 300 is separately provided on the second surface, the non-conductive region may be provided in the vicinity of the via holes 140 of the second surface, whereby a passband of the band pass filter 100 may be adjusted.

Figure 4:
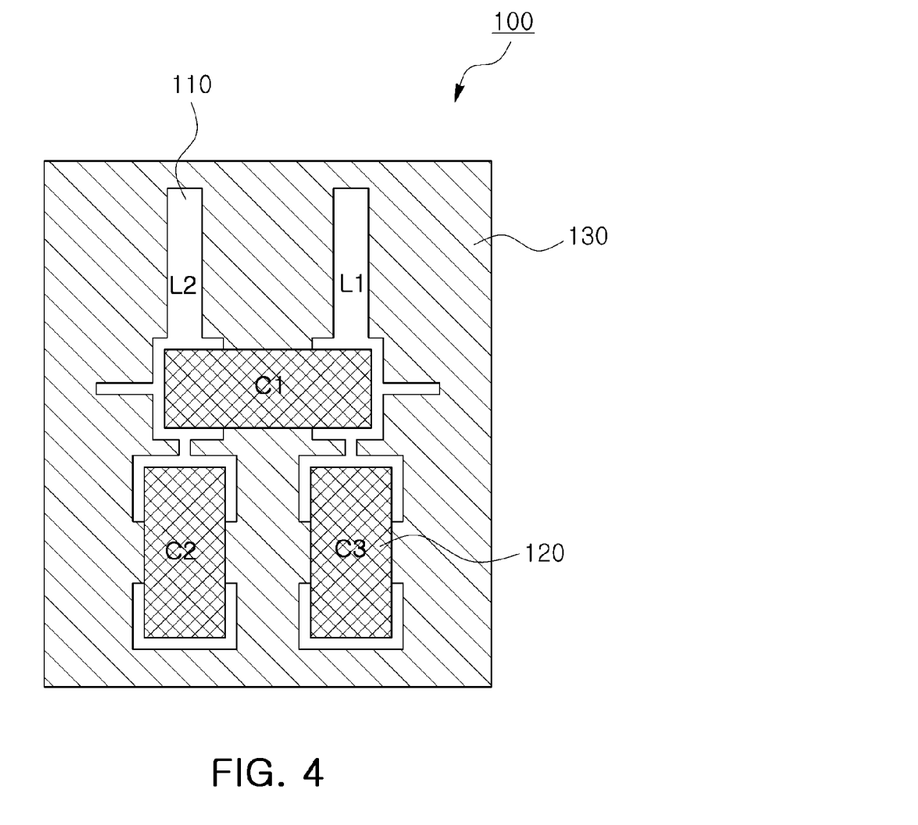

Referring to FIG. 4, a modification of the first surface of the band pass filter 100 is illustrated. Unlike the band pass filter 100 illustrated in FIG. 1, the third capacitor 120 C3 is disposed between the inductors 110 L1 and L2 and the first and second capacitors 120 C1 and C2. Here, a structure of the via hole connecting the first and second capacitors 120 C1 and C2 and the second surface of the band pass filter 100 may also be altered. In the case of the modification illustrated in FIG. 4, since the inductors 110 L1 and L2 are formed to face each other, resonance frequencies f1 and f2 are coupled due to mutual inductance and a passband is set.

Figure 5:
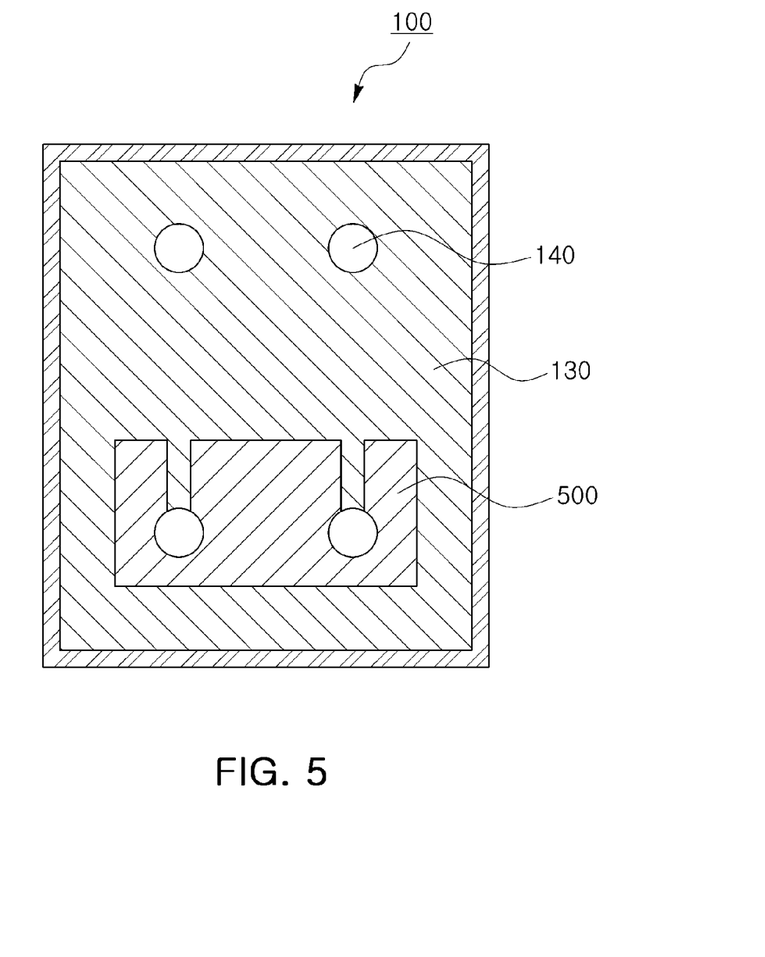
Figure 6:
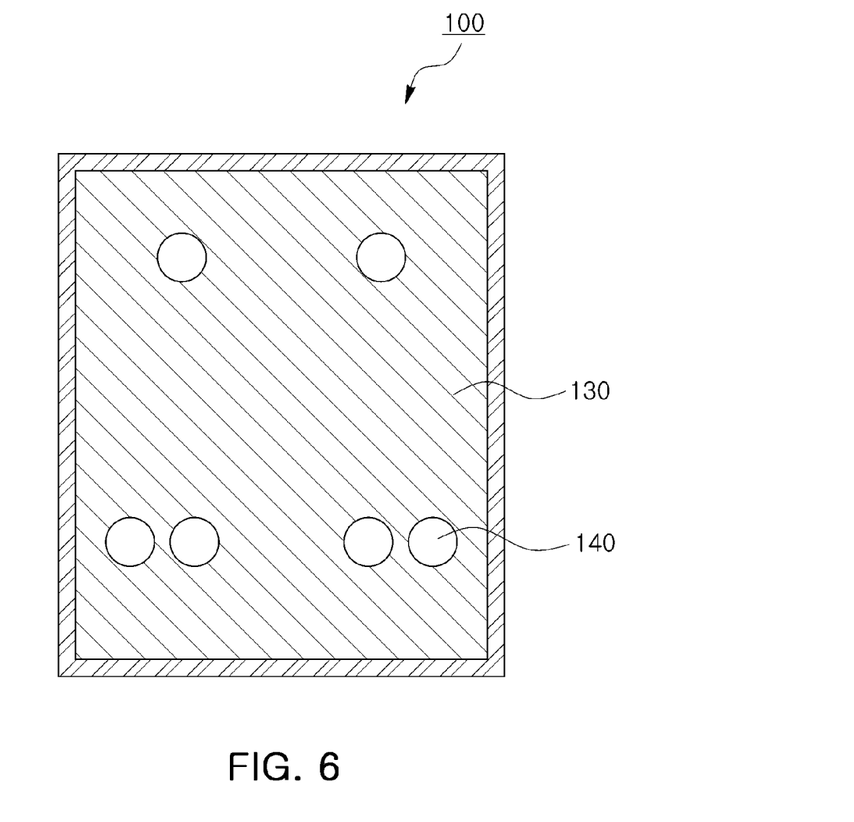
Figure 7:
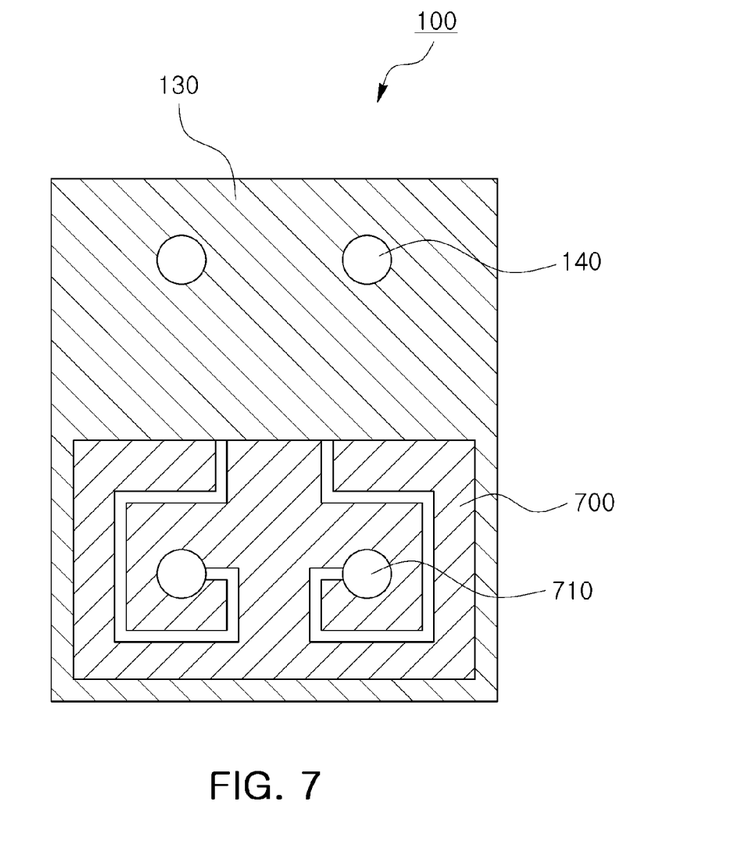

FIGS. 5 through 7 illustrate a modification of the second surface of the band pass filter 100. First, referring to FIG. 5, the via holes 140 are provided on the second surface of the band pass filter 100, and a conductive region 500 is added in the vicinity of the via holes 140. Here, the conductive region 500 in the vicinity of the via holes 140 may be connected through a linear or spiral structure, rather than being directly connected, thereby increasing inductance and resultantly lowering an attenuation frequency.

FIG. 6 illustrates a case in which the number of via holes is changed to change characteristics of the band pass filter 100. Referring to FIG. 6, one via hole 140 is connected to the inductors 110 L1 and L2, while two via holes 140 are connected to the first and second capacitors 120 C1 and C2. Namely, the number of via holes 140 is increased, and since the number of the via holes 140 is increased, inductance is lowered, and thus, an attenuation frequency can be increased.

FIG. 7 illustrates a case in which the via holes 140 and a conductive region 700 of the second surface are connected by a spiral structure 710. Thus, as described above, inductance of the band pass filter 100 can be increased, and thus, an attenuation frequency can be lowered.

Figure 8:
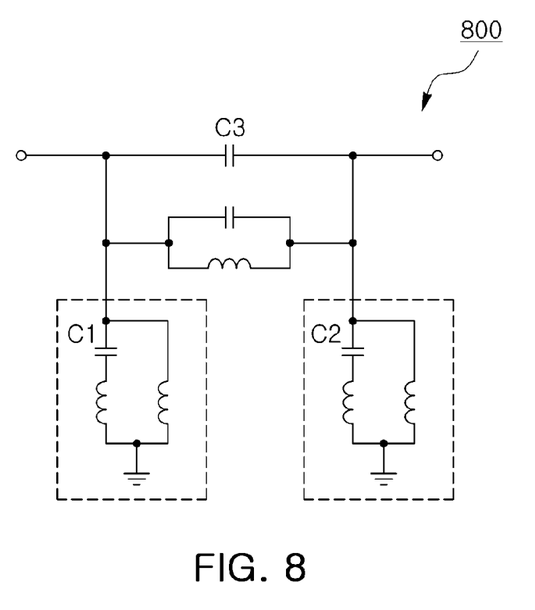
FIG. 8 is a circuit diagram illustrating an equivalent circuit of the band pass filter according to an embodiment of the present invention.

FIG. 8 is a circuit diagram illustrating an equivalent circuit of the band pass filter according to an embodiment of the present invention.

Referring to FIG. 8, a plurality of capacitors C1, C2, and C3 provided on the first surface of the band pass filter 100 may be included in the equivalent circuit. Here, a value of the inductor to which the first capacitor 120 C1 and the second capacitor 120 C2 are connected in series, respectively, may be determined according to the amount and shape of the via holes 140 connected to the first capacitors 120 C1 and C2.

Namely, as described above, when the number of the via holes 140 is increased, inductance is reduced, and when the shape of the second surface connected to the via holes 140 is changed into a line, a spiral shape, or the like, inductance is increased. Thus, unlike the existing structure not including an inductor connected to the first and second capacitors 120 C1 and C2 in series, in the band pass filter 100 according to the present embodiment, an attenuation frequency value can be selected.

As set forth above, according to embodiments of the invention, a plurality of conductive patterns are provided on different surfaces of a substrate including a plurality of via holes, and a plurality of capacitors are disposed on at least one surface of the substrate. The plurality of capacitors are connected to a portion of the conductive patterns directly or via a via hole, and an attenuation frequency value may be selected by adjusting the amount or shape of via holes or preparing a non-conductive region on a particular surface of the substrate. Also, by using a multilayer ceramic capacitor as the capacitor and a PCB as the substrate, manufacturing costs can be lowered and production yield in terms of process can be enhanced.

While the present invention has been shown and described in connection with the embodiments, it will be apparent to those skilled in the art that modifications and variations can be made without departing from the spirit and scope of the invention as defined by the appended claims.

What is claimed is:
1. A band pass filter comprising:
   a first substrate having a first surface and comprising capacitors and first conductive patterns provided on and facing the first surface; and
   a second substrate laminated with the first substrate and provided on and facing a second surface of the first substrate opposite the first surface, the second substrate connected to the first conductive patterns through via holes,
   wherein an attenuation frequency is determined according to the amount and shape of the via holes,
   at least one of the first conductive patterns is an inductor which extends from at least one of the capacitors to at least one of the via holes, and wherein the second substrate comprises a non-conductive region provided to be adjacent to a region in contact with the via holes, and
   at least one of the capacitors at least partially overlaps one or more of the first conductive patterns in a plan view.

2. The band pass filter of claim 1, wherein the attenuation frequency is inversely proportional to a length of the first conductive patterns and proportional to a width of the first conductive patterns.

3. The band pass filter of claim 1, wherein as the number of the via holes is increased, the attenuation frequency is determined to have a larger value.

4. The band pass filter of claim 1, wherein as an extended length of the via holes is lengthened by the shape of the via holes, the attenuation frequency is determined to have a smaller value.

5. The band pass filter of claim 1, wherein at least one of the via holes extends at least partly through and/or directly contacts the non-conductive region.

6. The band pass filter of claim 1, wherein the second substrate comprises one or more second conductive patterns connected to the first conductive patterns through the via holes.

7. The band pass filter of claim 6, wherein at least one of the one or more second conductive patterns is electrically grounded.

8. The band pass filter of claim 6, wherein at least one of the capacitors at least partially overlaps one or more of the second conductive patterns in a plan view.

9. The band pass filter of claim 1, wherein the capacitors comprise a multilayer ceramic capacitor (MLCC), and the first and second substrates are printed circuit boards (PCBs).

10. A band pass filter comprising:
a substrate having a laminated structure and comprising via holes;
capacitors provided on and facing a first surface of the substrate; and
a first conductive pattern provided on and facing the first surface to connect at least a portion of the capacitors,
wherein the first conductive pattern is connected to a second conductive pattern provided on a second surface of the substrate, opposite the first surface, through the via holes,
the first conductive pattern is an inductor which extends from at least one of the capacitors to at least one of the via holes,
the second surface comprises a non-conductive region provided to be adjacent to a region in contact with the via holes, and
at least one of the capacitors at least partially overlaps the second conductor in a plan view.

11. The band pass filter of claim 10, wherein the band pass filter has an attenuation frequency determined by at least one of capacitance of the capacitors and the amount and shape of the via holes.

12. The band pass filter of claim 10, wherein at least one of the capacitors at least partially overlaps the first conductive pattern in a plan view.

13. The band pass filter of claim 10, wherein the substrate is a printed circuit board and the capacitors comprise one or more multilayer ceramic capacitors.

14. The band pass filter of claim 10, wherein at least one of the via holes extends at least partly through and/or directly contacts the non-conductive region.

15. The band pass filter of claim 10, wherein the attenuation frequency is inversely proportional to a length of the first conductive pattern and proportional to a width of the first conductive pattern.

16. The band pass filter of claim 10, wherein at least a portion of the second conductive pattern is electrically grounded.

* * * * *